United States Patent
Hirata et al.

(10) Patent No.: US 7,482,829 B2
(45) Date of Patent: Jan. 27, 2009

(54) ELECTRIC POWER APPLYING CIRCUIT AND TEST APPARATUS

(75) Inventors: Kazunari Hirata, Tokyo (JP); Tadaaki Satoh, Tokyo (JP); Masahiro Nagata, Tokyo (JP)

(73) Assignee: Advantest Corporation, Tokyo (JP)

( * ) Notice: Subject to any disclaimer, the term of this patent is extended or adjusted under 35 U.S.C. 154(b) by 194 days.

(21) Appl. No.: 11/683,436

(22) Filed: Mar. 8, 2007

(65) Prior Publication Data
US 2007/0252571 A1 Nov. 1, 2007

Related U.S. Application Data

(63) Continuation of application No. PCT/JP2007/053798, filed on Feb. 28, 2007.

(30) Foreign Application Priority Data
Apr. 28, 2006 (JP) ............................. 2006-126608

(51) Int. Cl.
*G01R 31/26* (2006.01)
(52) U.S. Cl. .................................... 324/765
(58) Field of Classification Search .............. 324/158.1, 324/760, 763, 765–769; 714/724–734
See application file for complete search history.

(56) References Cited

U.S. PATENT DOCUMENTS 7,298,150 B2 * 11/2007 Amanuma .................. 324/522
7,301,359 B2 * 11/2007 Furukawa .................... 324/765

FOREIGN PATENT DOCUMENTS

| JP | 05-119110 | 5/1993 |
|---|---|---|
| JP | 08-327691 A | 12/1996 |
| JP | 2000-292478 A | 10/2000 |

* cited by examiner

*Primary Examiner*—Ha Tran T Nguyen
*Assistant Examiner*—Trung Q Nguyen
(74) *Attorney, Agent, or Firm*—Jianq Chyun IP Office

(57) ABSTRACT

There is provided an electric power applying circuit for applying a direct current power to a load. The electric power applying circuit includes an output buffer that (i) is supplied with, as power source voltages, positive and negative high voltages which are determined in accordance with a range of an applied voltage which is to be applied to the load, (ii) generates a voltage in accordance with an input voltage, within a range defined by the power source voltages, and (iii) applies the generated voltage to the load, a main amplifier that amplifies a voltage input thereto to generate the input voltage, and inputs the generated input voltage into the output buffer, wherein the main amplifier exhibits a higher accuracy in terms of voltage generation than the output buffer, and a floating power source that generates positive and negative floating voltages by using, as a reference, a voltage determined in accordance with a voltage output from the output buffer, and supplies the generated positive and negative floating voltages to the main amplifier as power source voltages thereof, wherein a difference in voltage between the positive and negative floating voltages is smaller than a difference in voltage between the positive and negative high voltages.

21 Claims, 10 Drawing Sheets

ELECTRIC POWER APPLYING CIRCUIT AND TEST APPARATUS

CROSS REFERENCE TO RELATED APPLICATION

This is a continuation application of PCT/JP2007/053798 filed on Feb. 28, 2007 which claims priority from a Japanese Patent Application No. 2006-126608 filed on Apr. 28, 2006, the contents of which are incorporated herein by reference.

BACKGROUND

1. Technical Field

The present invention relates to an electric power applying circuit for supplying power to a load, and a test apparatus for testing a device under test (DUT). More particularly, the present invention relates to an electric power applying circuit for supplying a direct current (DC) power to a load and a test apparatus for conducting a DC test on a DUT.

2. Related Art

It is known that a device under test (DUT) such as a semiconductor circuit is tested by way of direct current (DC) tests according to which, for example, a voltage is applied and a resultant current is measured, and a current is applied and a resultant voltage is measured. In the case of a test in which a voltage is applied and a resultant current is measured, for example, while applying a predetermined DC voltage to the DUT, a test apparatus detects a DC current flowing within the DUT when the DUT is operating or not operating. When the detected DC current does not fall within a predetermined range, the test apparatus judges the DUT to be defective.

A conventionally known circuit for supplying a DC power to a DUT is constituted by using an amplifier, for example, as disclosed in Unexamined Japanese Patent Application Publication No. H05-119110. The amplifier amplifies an input voltage, and applies the amplified voltage to the DUT.

To apply, to the DUT, a voltage whose voltage value is high and highly accurately controlled, the circuit needs to be constituted by using a high-accuracy and high-voltage amplifier. Such an amplifier is expensive, thereby increasing the cost of the circuit.

As disclosed in Patent Document 1, for example, a voltage-applying/current-measuring circuit is known which applies a constant voltage to a DUT and measures a current supplied to the DUT. When the voltage-applying/current-measuring circuit applies a high voltage to the DUT, each of the elements constituting the circuit needs to be formed by using a high-accuracy and high-voltage element.

Even when a floating power source is used to supply power source voltages to some of the elements constituting the circuit as disclosed in FIG. 1 of Patent Document 1, constituents such as a main amplifier 13, a differential amplifier 21, and a resistor 25 need to be configured by using high-accuracy and high-voltage elements. This increases the cost of the circuit. Furthermore, since the floating power source is used for some of the elements constituting the circuit, the circuit has a complex configuration, which also contributes to an increase in the cost of the circuit.

In view of the above, an advantage of some embodiments of the present invention is to provide an electric power applying circuit and a test apparatus which can solve the above-described problems. This advantage is achieved by combining the features recited in the independent claims. The dependent claims define further effective specific example of the present invention.

SUMMARY

To solve the above-mentioned problems, a first embodiment of the present invention provides an electric power applying circuit for applying a direct current power to a load. The electric power applying circuit includes an output buffer that (i) is supplied with, as power source voltages, positive and negative high voltages which are determined in accordance with a range of an applied voltage which is to be applied to the load, (ii) generates a voltage in accordance with an input voltage, within a range defined by the power source voltages, and (iii) applies the generated voltage to the load, a main amplifier that amplifies a voltage input thereto to generate the input voltage, and inputs the generated input voltage into the output buffer, wherein the main amplifier exhibits a higher accuracy in terms of voltage generation than the output buffer, and a floating power source that generates positive and negative floating voltages by using, as a reference, a voltage determined in accordance with a voltage output from the output buffer, and supplies the generated positive and negative floating voltages to the main amplifier as power source voltages thereof, wherein a difference in voltage between the positive and negative floating voltages is smaller than a difference in voltage between the positive and negative high voltages.

A second embodiment of the present invention provides a test apparatus for testing a device under test. The test apparatus includes the electric power applying circuit relating to the first embodiment which supplies a direct current power to the device under test, a detecting section that detects one of a voltage and a current supplied to the device under test, and a judging section that judges whether the device under test is acceptable based on the voltage or current detected by the detecting section.

Here, all the necessary features of the present invention are not listed in the summary. The sub-combinations of the features may become the invention.

DESCRIPTION OF EXEMPLARY EMBODIMENTS

Figure 1:
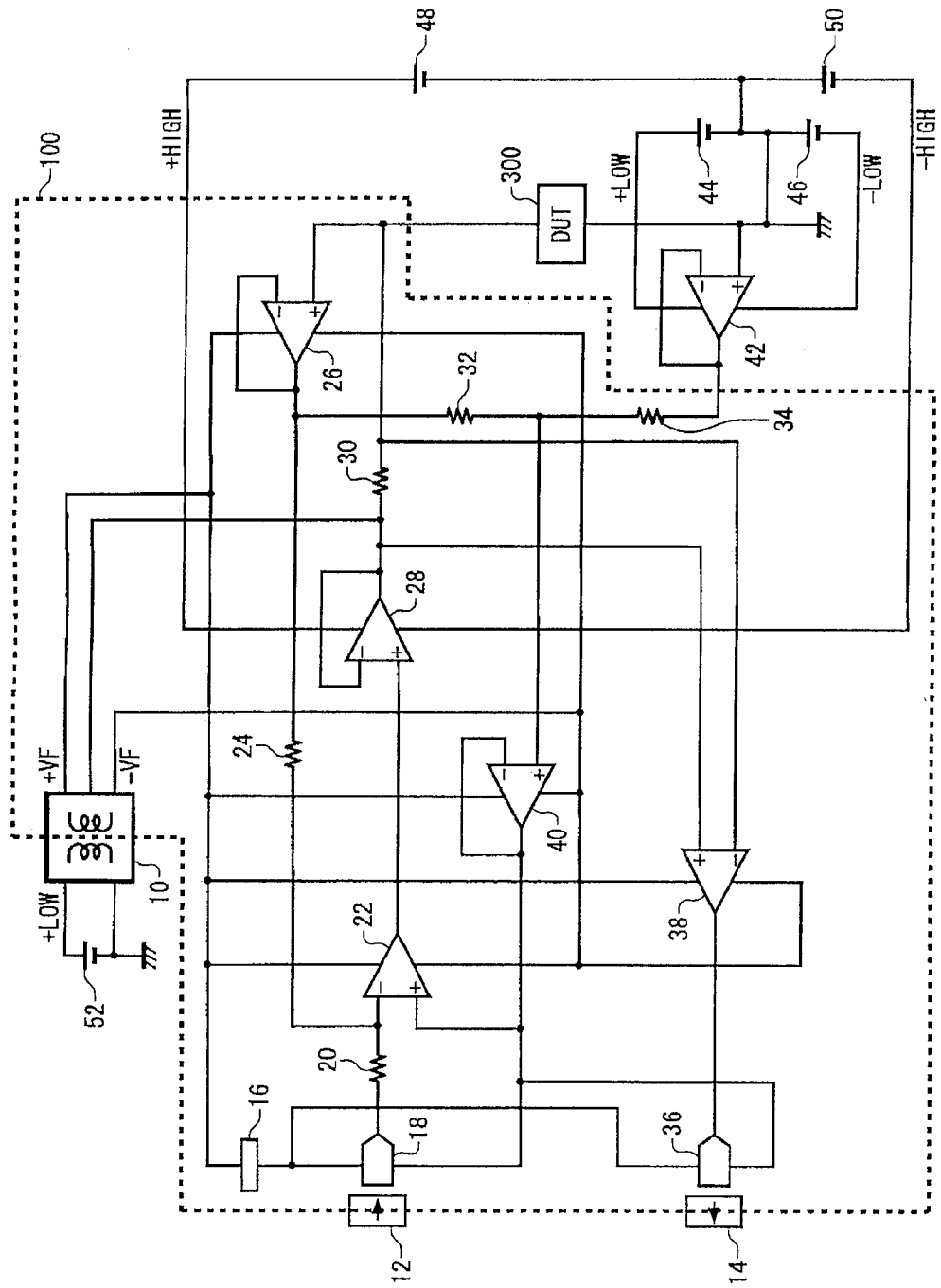
FIG. 1 illustrates an exemplary configuration of an electric power applying circuit 100 relating to an embodiment of the present invention.

Hereinafter, one aspect of the present invention will be described through some embodiments. The embodiments do not limit the invention according to the claims, and all the combinations of the features described in the embodiments are not necessarily essential to means provided by aspects of the invention.

FIG. 1 illustrates an exemplary configuration of an electric power applying circuit 100 relating to an embodiment of the present invention. The electric power applying circuit 100 applies direct current (DC) power to a load. According to the present embodiment, the electric power applying circuit 100 measures a DC current supplied to a device under test (DUT) 300 such as a semiconductor circuit, when applying a predetermined DC voltage to the DUT 300.

The electric power applying circuit 100 includes therein a floating power source 10, a photocoupler 12, a photocoupler 14, a voltage converter 16, a DA converter 18, an AD converter 36, a main amplifier 22, an output buffer 28, a voltage detecting amplifier 26, a reference amplifier 40, a current detecting amplifier 38, a resistance 20, a resistance 24, a current detecting resistance 30, a first voltage dividing resistance 32, and a second voltage dividing resistance 34.

The photocoupler 12 receives digital data of an optical signal indicating a voltage value of an applied voltage to be applied to the DUT 300, and supplies the received digital data to the DA converter 18. In place of the photocoupler 12, the electric power applying circuit 100 may include therein an isolator such as a pulse transformer. In other words, the DA converter 18 is electrically insulated from an external device outside the electric power applying circuit 100. The DA converter 18 outputs a DC voltage having a voltage value determined in accordance with the received digital data. The DA converter 18 may generate the DC voltage based on the digital data of the optical signal, or based on the digital data which has been converted into an electrical signal by a photoelectric converter circuit or the like.

The main amplifier 22 amplifies the DC voltage output from the DA converter 18, to generate an input voltage, and inputs the generated input voltage into the output buffer 28. According to the present embodiment, the input voltage generated by the main amplifier 22 is the applied voltage to be applied to the DUT 300. If such is the case, the output buffer 28 may be a voltage follower circuit. Here, the main amplifier 22 may be a differential amplifier, for example. The amplifying ratio of the main amplifier 22 is determined in accordance with the ratio between the resistance value of the resistance 20 which electrically connects the negative input terminal of the main amplifier 22 and the DA converter 18 to each other and the resistance value of the resistance 24 which is provided on a feedback path connected to the negative input terminal of the main amplifier 22. For example, the amplifying ratio of the main amplifier 22 is expressed as $-Rf/Rs$, when the resistance values of the resistances 20 and 24 are respectively Rs and Rf.

The output buffer 28 generates a voltage in accordance with the input voltage input thereto by the main amplifier 22, and outputs the generated voltage. According to the present embodiment, the output buffer 28 is a voltage follower circuit, and outputs the applied voltage in accordance with the input voltage. The output buffer 28 is supplied with, as power source voltages, positive and negative high voltages (+HIGH and −HIGH) which correspond to the range of the applied voltage which is to be applied to the load. In other words, the output buffer 28 can output the applied voltage within the range defined by the power source voltages.

As described above, the main amplifier 22 generates the applied voltage which is to be applied to the DUT 300, and the output buffer 28 applies the generated voltage to the DUT 300. Therefore, it is preferable that the main amplifier 22 is configured by using a higher-accuracy amplifier than the output buffer 28. For example, the main amplifier 22 may accurately amplify a smaller input voltage than the output buffer 28.

The floating power source 10 generates positive and negative floating voltages (+VF and −VF), by using, as a reference, the applied voltage which is output from the output buffer 28. The difference in voltage between the positive and negative floating voltages may be smaller than the difference in voltage between the positive and negative power source voltages supplied to the output buffer 28. The floating power source 10 may generate the positive and negative floating voltages by using, as the middle point, the applied voltage which is output from the output buffer 28. The floating power source 10 may be a DC/DC converter, for example, and generate the floating voltages based on the voltage generated by the DC power source 52.

The floating power source 10 supplies the generated floating voltages to the main amplifier 22 as the power source voltages. In other words, the main amplifier 22 is capable of generating a voltage within the range defined by the positive and negative floating voltages. Since the floating voltages are generated by using as the middle point the applied voltage, the applied voltage which is generated by the main amplifier 22 can fall within the voltage range defined by the floating voltages.

As mentioned above, the difference in voltage between the positive and negative floating voltages can be set smaller than the difference in voltage between the positive and negative power source voltages applied to the output buffer 28. Therefore, the main amplifier 22 can be configured by using a lower-voltage amplifier than the output buffer 28. For example, the main amplifier 22 may be configured by using a transistor which is capable of withstanding a lower voltage than the transistor included in the output buffer 28.

As described above, the electric power applying circuit 100 can generate a high-accuracy and high-voltage applied voltage, by using, as the main amplifier 22, a high-accuracy and low-voltage amplifier and, as the output buffer 28, a low-accuracy and high-voltage amplifier. In other words, the electric power applying circuit 100 can generate a high-accuracy and high-voltage applied voltage, without using a high-accuracy and high-voltage amplifier. As a consequence, the cost of the electric power applying circuit 100 can be reduced.

The reference amplifier 40 generates a reference voltage for a circuit which is supplied with power source voltages from the floating power source 10. For example, the reference amplifier 40 generates a reference voltage which is used as a reference of the voltage output from the main amplifier 22, based on the voltage output from the output buffer 28, and inputs the generated reference voltage into the main amplifier 22. According to the present embodiment, the floating power source 10 also supplies the floating voltages to the reference amplifier 40 as the power source voltages. Being supplied with the positive and negative floating voltages as the power source voltages, the reference amplifier 40 generates the reference voltage within the voltage range defined by the positive and negative floating voltages. Having the above-described configuration, the reference amplifier 40 can be configured by using a low-voltage amplifier.

The reference amplifier 40 may input the reference voltage into the positive input terminal of the main amplifier 22. The reference amplifier 40 may be a voltage follower circuit which receives the voltage generated by dividing the applied voltage which is applied to the DUT 300 and inputs the received voltage into the main amplifier 22. The main amplifier 22 amplifies the difference in voltage between the reference voltage and the voltage at the negative input terminal, and outputs the result of the amplification.

The voltage detecting amplifier 26 feeds back the applied voltage which is applied to the DUT 300 to the main amplifier 22 via the resistance 24, so that the applied voltage which is output from the main amplifier 22 is maintained at a substantially constant voltage level. According to the present embodiment, the voltage detecting amplifier 26 is a voltage follower circuit, and the output end of the voltage detecting amplifier 26 is connected to the negative input end of the main amplifier 22. The floating power source 10 may supply the floating voltages to the voltage detecting amplifier 26 as the power source voltages. Having the above-described configuration, the voltage detecting amplifier 26 can be configured by using a low-voltage amplifier.

The first and second voltage dividing resistances 32 and 34 divide the applied voltage which is applied to the DUT 300. According to the present embodiment, the first and second voltage dividing resistances 32 and 34 are provided in series between the voltage detecting amplifier 26 and the ground potential. Therefore, a reference voltage Vgnd can be expressed as R2×Vin/(R1+R2), when the resistance values of the first and second voltage dividing resistances 32 and 34 are respectively R1 and R2, and the applied voltage is Vin.

According to the present embodiment, the first voltage dividing resistance 32 is connected at one end to the voltage detecting amplifier 26, and supplied with the applied voltage. The first voltage dividing resistance 32 is electrically connected at the other end to the second voltage dividing resistance 34. The second voltage dividing resistance 34 is electrically connected at one end to the first voltage dividing resistance 32, and supplied at the other end with the ground potential. Here, the resistance value of the second voltage dividing resistance 34 may be equal to or higher than the resistance value of the first voltage dividing resistance 32. Also, the first voltage dividing resistance 32 may be capable of withstanding a lower voltage than the second voltage dividing resistance 34.

The point at which the first and second voltage dividing resistances 32 and 34 are connected to each other is connected to the positive input terminal of the reference amplifier. The reference amplifier 40 generates the reference voltage based on the voltage generated by voltage division of the first and second voltage dividing resistances 32 and 34. According to the present embodiment, the reference amplifier 40 outputs the voltage generated by the voltage division as the reference voltage. The reference amplifier 40 may further supply the reference voltage to the current detecting amplifier 38.

The current detecting resistance 30 is provided between the output end of the output buffer 28 and the DUT 300. The current detecting amplifier 38 detects the voltages applied to the both ends of the current detecting resistance 30. The current detecting amplifier 38 is a differential amplifier, for example, and input, at the positive and negative input ends thereof, with the potentials at the both ends of the current detecting resistance 30. The floating power source 10 also supplies the floating voltages to the current detecting amplifier 38 as the power source voltages. Having the above-described configuration, the current detecting amplifier 38 can be configured by using a low-voltage amplifier.

The AD converter 36 functions as a current detecting section which detects the value of the current to be supplied to the DUT 300, based on the voltage output from the current detecting amplifier 38. The AD converter 36 converts the value of the voltage output from the current detecting amplifier 38 into a digital value. The photocoupler 14 transmits, to an external device, an optical signal having the digital data output from the AD converter 36. The electric power applying circuit 100 may further include therein an electric-photo converter circuit which converts the digital data output from the AD converter 36 into the optical signal.

The voltage converter 16 converts the positive floating voltage into a predetermined voltage, and supplies the predetermined voltage to the DA converter 18 and AD converter 36 as the positive power source voltage. The reference amplifier 40 supplies the reference voltage to the DA converter 18 and AD converter 36 as the negative power source voltage.

The electric power applying circuit 100 may further include therein a plurality of DC power sources (44, 46, 48 and 50) and a buffer 42. The buffer 42 outputs a GND reference voltage for the DUT 300. According to the present embodiment, the GND reference voltage for the DUT 300 is the ground potential. The DC power sources 44 and 46 respectively generate the positive and negative power source voltages for the buffer 42. The DC power sources 48 and 50 respectively generate the positive and negative power source voltages of the output buffer 28.

The electric power applying circuit 100 described above can apply a high-accuracy and high-voltage voltage to the DUT 300 without requiring a high-accuracy and high-voltage amplifier. In addition, the elements constituting the electric power applying circuit 100 can be configured by using low-voltage elements, except for the output buffer 28 and second voltage dividing resistance 34. Consequently, the cost of the electric power applying circuit 100 can be reduced.

Figure 2:
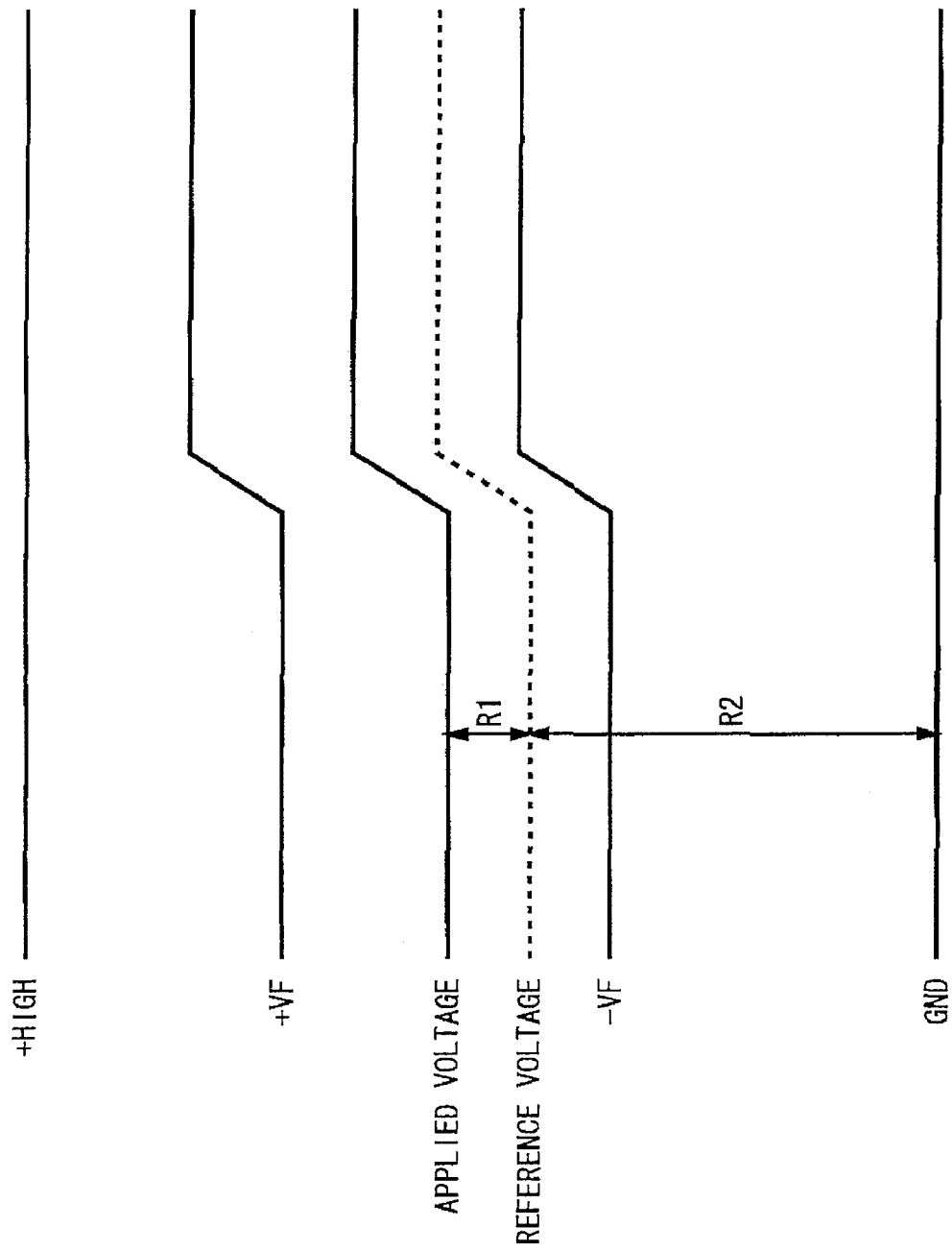
FIG. 2 is used to illustrate voltages in the electric power applying circuit 100.

FIG. 2 is used to illustrate the voltages in the electric power applying circuit 100. As described above, the output buffer 28 is supplied with the positive and negative power source voltages (+HIGH and −HIGH). Here, it is preferable that the voltage range defined by the positive and negative power source voltages includes therein the voltage range for the applied voltage which is applied to the DUT 300.

The output buffer 28 outputs the applied voltage which falls within the voltage range defined by the power source voltages. The floating power source 10 generates the positive and negative floating voltages (+VF and −VF) by using, as the middle point, the applied voltage. The positive floating voltage is obtained by adding a predetermined voltage to the applied voltage, and the negative floating voltage is obtained by subtracting the predetermined voltage from the applied voltage. The positive and negative floating voltages may fall within the voltage range defined by the power source voltages (+HIGH and −HIGH). The main amplifier 22, voltage detecting amplifier 26, reference amplifier 40, and current detecting amplifier 38 respectively output voltages in the vicinity of the applied voltage, and thus can be driven with the floating voltages being supplied as the power source voltages. Here, the floating voltages vary in accordance with the applied voltage.

As described above, the reference amplifier 40 outputs the reference voltage which is generated by dividing the applied voltage by the resistance values R1 and R2 of the first and second voltage dividing resistances 32 and 34. The reference voltage may be equal to or lower than the positive floating voltage (+VF), and equal to or higher than the negative floating voltage (−VF). The differential amplifiers including the main amplifier 22 and current detecting amplifier 38 respectively output voltages with the reference voltage being set as a reference.

Figure 3:
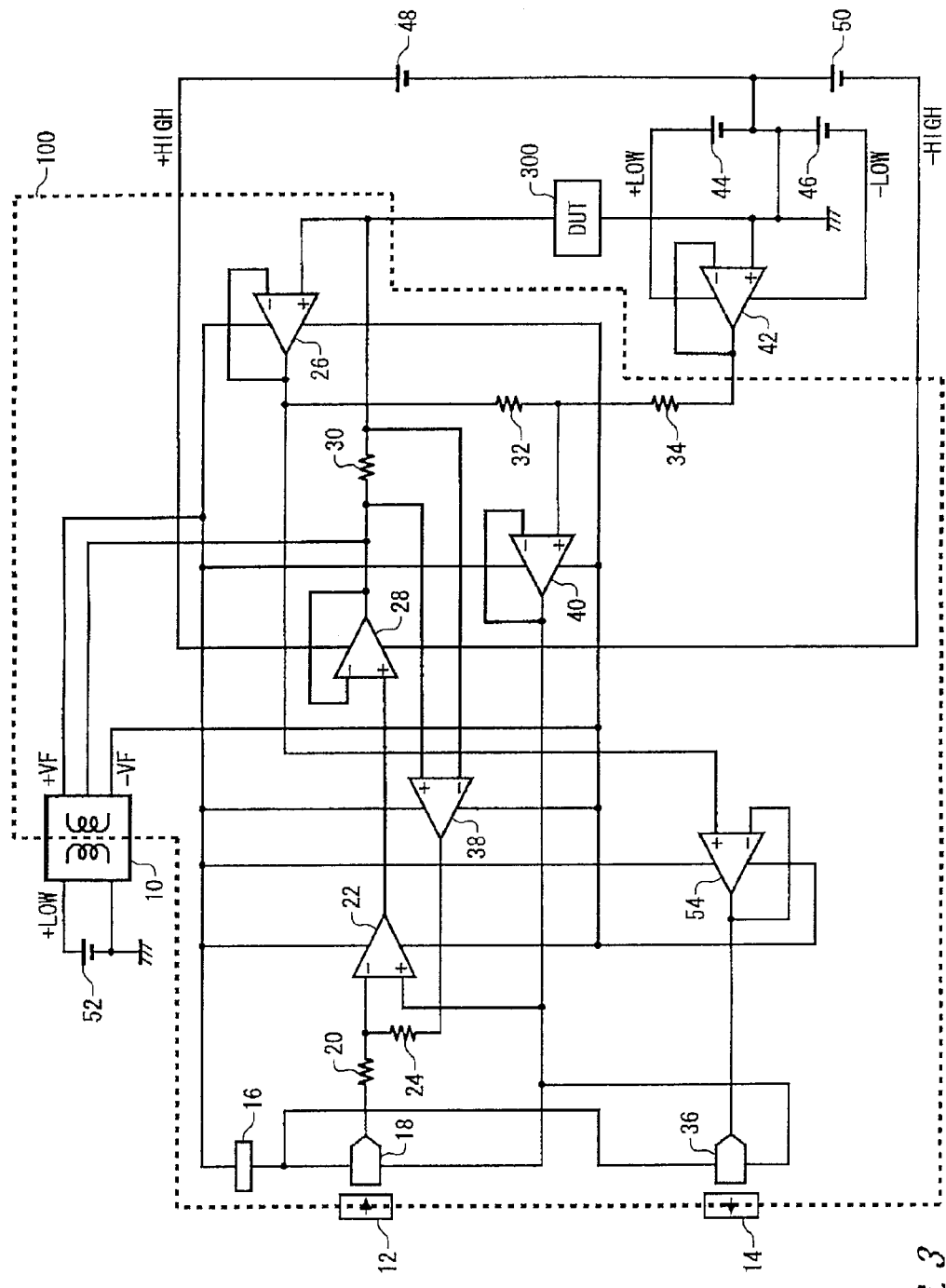
FIG. 3 illustrates another exemplary configuration of the electric power applying circuit 100.

FIG. 3 illustrates another exemplary configuration of the electric power applying circuit 100. According to the present embodiment, the electric power applying circuit 100 measures a resultant DC voltage to be applied to the DUT 300 such as a semiconductor circuit when supplying a predetermined DC current to the DUT 300.

According to the present embodiment, the electric power applying circuit 100 further includes therein a buffer 54, in addition to the constituents of the electric power applying circuit 100 described with reference to FIG. 1. The other constituents of the electric power applying circuit 100 may have the same functions as the corresponding constituents assigned with the same reference numerals in FIG. 1.

In the electric power applying circuit 100 relating to the present embodiment, the voltage output from the current detecting amplifier 38 is fed back into the negative input terminal of the main amplifier 22 via the resistance 24. With this configuration, the electric power applying circuit 100 relating to the present embodiment can maintain the current output from the output buffer 28 at a substantially constant current level.

In the electric power applying circuit 100 relating to the present embodiment, the voltage output from the voltage detecting amplifier 26 is input into the AD converter 36 via the buffer 54. Here, the electric power applying circuit 100 relating to the present embodiment may not include therein the buffer 54. The AD converter 36 relating to the present embodiment functions as a voltage detecting section which detects the voltage value of the applied voltage which is applied to the DUT 300 based on the voltage output from the voltage detecting amplifier 26. The floating power source 10 further supplies the floating voltages to the buffer 54 as the power source voltages.

Having the above-described configurations, the electric power applying circuit 100 can measure the resultant voltage when the current is applied. Similarly to the electric power applying circuit 100 described with reference to FIG. 1, the electric power applying circuit 100 relating to the present embodiment can apply a high-accuracy and high-voltage voltage to the DUT 300 without requiring a high-accuracy and high-voltage amplifier. In addition, the elements constituting the electric power applying circuit 100 can be configured by using low-voltage elements, except for the output buffer 28 and second voltage dividing resistance 34. Consequently, the cost of the electric power applying circuit 100 can be reduced.

Figure 4:
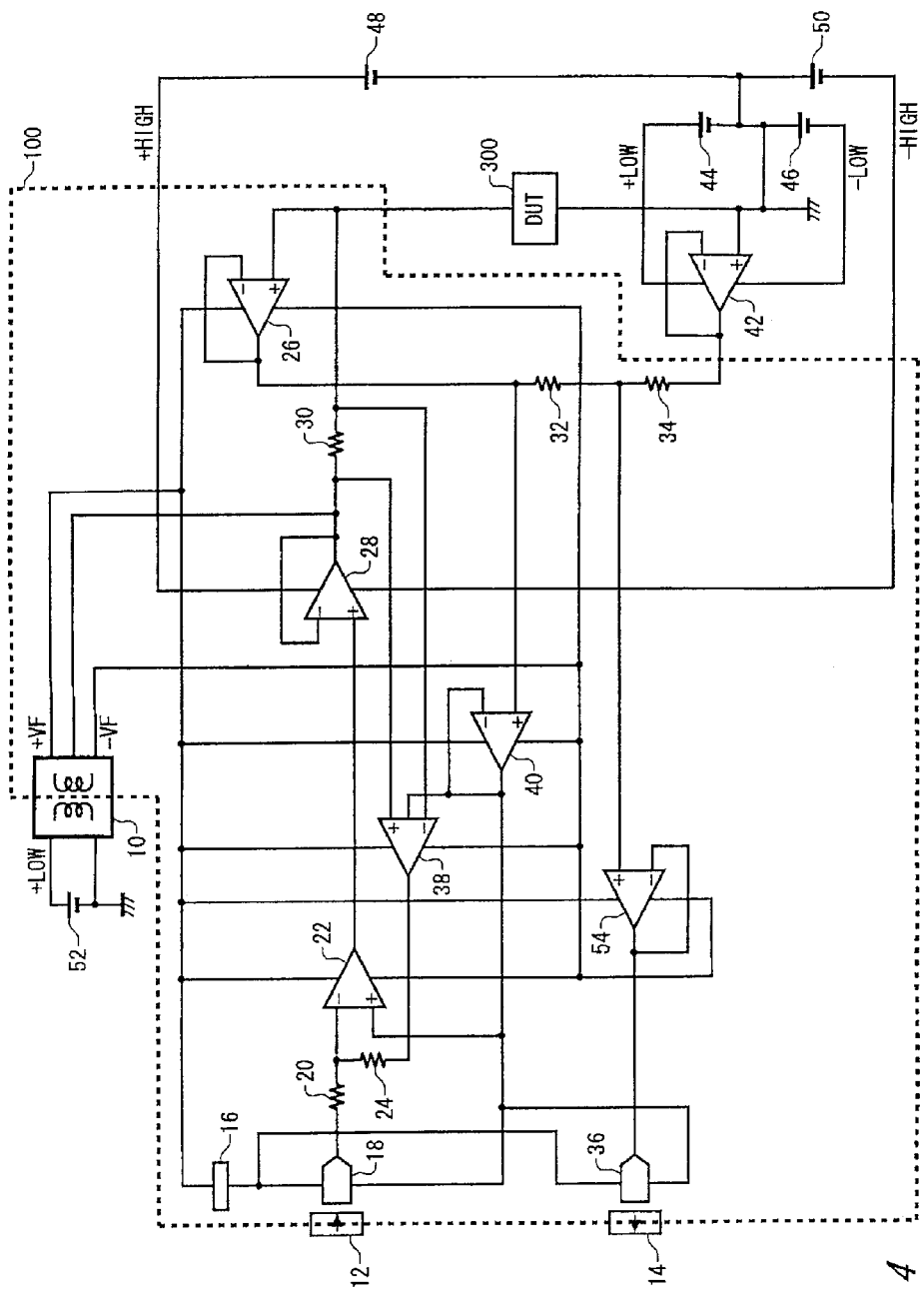
FIG. 4 illustrates another exemplary configuration of the electric power applying circuit 100.

FIG. 4 illustrates another exemplary configuration of the electric power applying circuit 100. According to the present embodiment, the electric power applying circuit 100 measures a resultant DC voltage to be applied to the DUT 300 such as a semiconductor circuit, when supplying a predetermined DC current to the DUT 300.

The electric power applying circuit 100 relating to the present embodiment includes therein the same constituents as the electric power applying circuit 100 described with reference to FIG. 3, but is different in terms of how the constituents are connected to each other. According to the present embodiment, the output end of the voltage detecting amplifier 26 is connected to the first voltage dividing resistance 32 and the positive input terminal of the reference amplifier 40. The reference amplifier 40 supplies the reference voltage to the main amplifier 22 and current detecting amplifier 38, similarly to the reference amplifier 40 described with reference to FIG. 3.

The positive input terminal of the buffer 54 is electrically connected to the point at which the first and second voltage dividing resistances 32 and 34 are connected to each other. In other words, the buffer 54 inputs, into the AD converter 36, the voltage generated by dividing the applied voltage which is applied to the DUT 300 by the resistance ratio between the first and second voltage dividing resistances 32 and 34.

The electric power applying circuit 100 having the above-described configurations can also measure a resultant voltage when a current is applied, similarly to the electric power applying circuit 100 described with reference to FIG. 3. The electric power applying circuit 100 relating to the present embodiment can apply a high-accuracy and high-voltage voltage to the DUT 300 without requiring a high-accuracy and high-voltage amplifier, similarly to the electric power applying circuit 100 described with reference to FIG. 1. In addition, the elements constituting the electric power applying circuit 100 can be configured by using low-voltage elements, except for the output buffer 28 and second voltage dividing resistance 34. Consequently, the cost of the electric power applying circuit 100 can be reduced.

Figure 5:
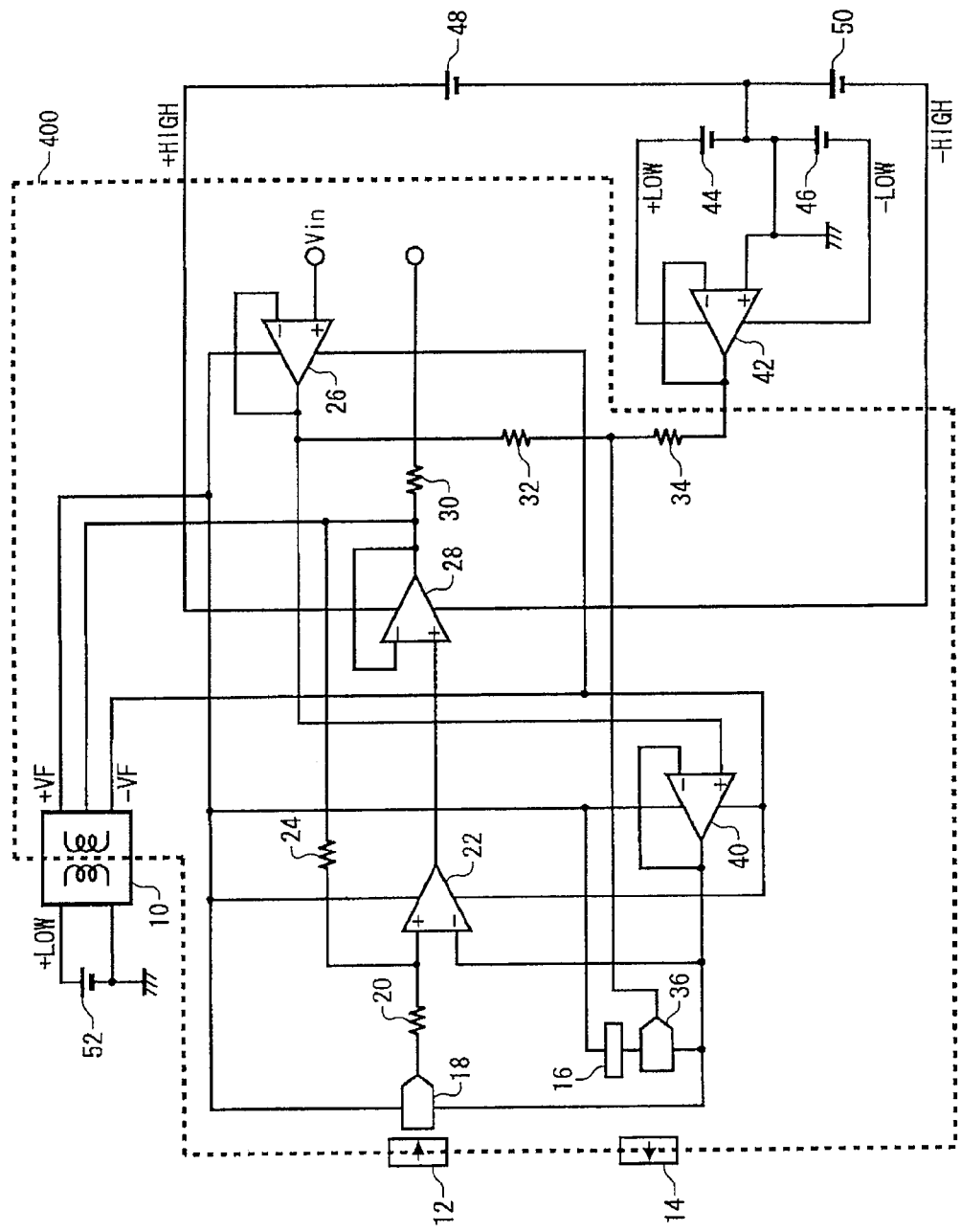
FIG. 5 illustrates an exemplary configuration of a voltage measuring circuit 400 relating to an embodiment of the present invention.

FIG. 5 illustrates an exemplary configuration of a voltage measuring circuit 400 relating to an embodiment of the present invention. The voltage measuring circuit 400 measures the voltage value of the input voltage Vin. The voltage measuring circuit 400 includes therein the floating power source 10, photocoupler 12, photocoupler 14, voltage converter 16, DA converter 18, AD converter 36, main amplifier 22, output buffer 28, voltage detecting amplifier 26, resistance 20, resistance 24, current detecting resistance 30, reference amplifier 40, first voltage dividing resistance 32, and second voltage dividing resistance 34. The voltage measuring circuit 400 relating to the present embodiment has the same constituents as the electric power applying circuit 100 described with reference to FIG. 1, except for the current detecting amplifier 38, but is different in terms of how the constituents are connected to each other.

The voltage measuring circuit 400 may further include therein a switching section that switches the method of connecting the constituents to each other, between the method used in the electric power applying circuit 100 described with reference to FIG. 1 and the method used in the voltage measuring circuit 400. The switching section enables the voltage measuring circuit 400 to function as the voltage measuring circuit 400 and the electric power applying circuit 100.

The voltage detecting amplifier 26 is input with the input voltage Vin which is to be measured. The voltage output from the voltage detecting amplifier 26 is divided by the first and second voltage dividing resistances 32 and 34, and then input into the AD converter 36. With the above-described configuration, the voltage measuring circuit 400 can achieve a wide measuring range for measuring the voltage value of the input voltage Vin.

The output end of the voltage detecting amplifier 26 is connected to the positive input terminal of the reference amplifier 40. Similarly to the reference amplifier 40 shown in FIG. 1, the reference amplifier 40 relating to the present embodiment supplies the reference voltage to the main amplifier 22, DA converter 18 and AD converter 36.

The output end of the output buffer 28 is connected to the middle-point potential of the floating power source 10. The output end of the output buffer 28 is also connected to the positive input end of the main amplifier 22 via the resistance 24. The output end of the output buffer 28 is released via the current detecting resistance 30.

The main amplifier 22 amplifies a voltage supplied thereto, and supplies the amplified voltage to the output buffer 28. The voltage output from the output buffer 28 is used as the middle point for the floating voltages. The floating voltages are supplied, as the power source voltages, to the voltage detecting amplifier 26, main amplifier 22 and reference amplifier 40. Therefore, the main amplifier 22 may output a voltage determined in accordance with the input voltage Vin, so that the voltage measuring circuit 400 can measure the input voltage Vin. For example, the main amplifier 22 may output a voltage having a voltage value in the vicinity of an expected voltage value of the input voltage Vin.

The DA converter 18 receives the positive floating voltage as the positive power source voltage and the reference voltage as the negative power source voltage. The AD converter 36 receives the positive floating voltage via the voltage converter 16 as the positive power source voltage and the reference voltage as the negative power source voltage. Having the above-described configurations, the voltage measuring circuit 400 can achieve a wide measuring range for measuring the input voltage Vin, based on the same circuit as the electric power applying circuit 100.

Figure 6:
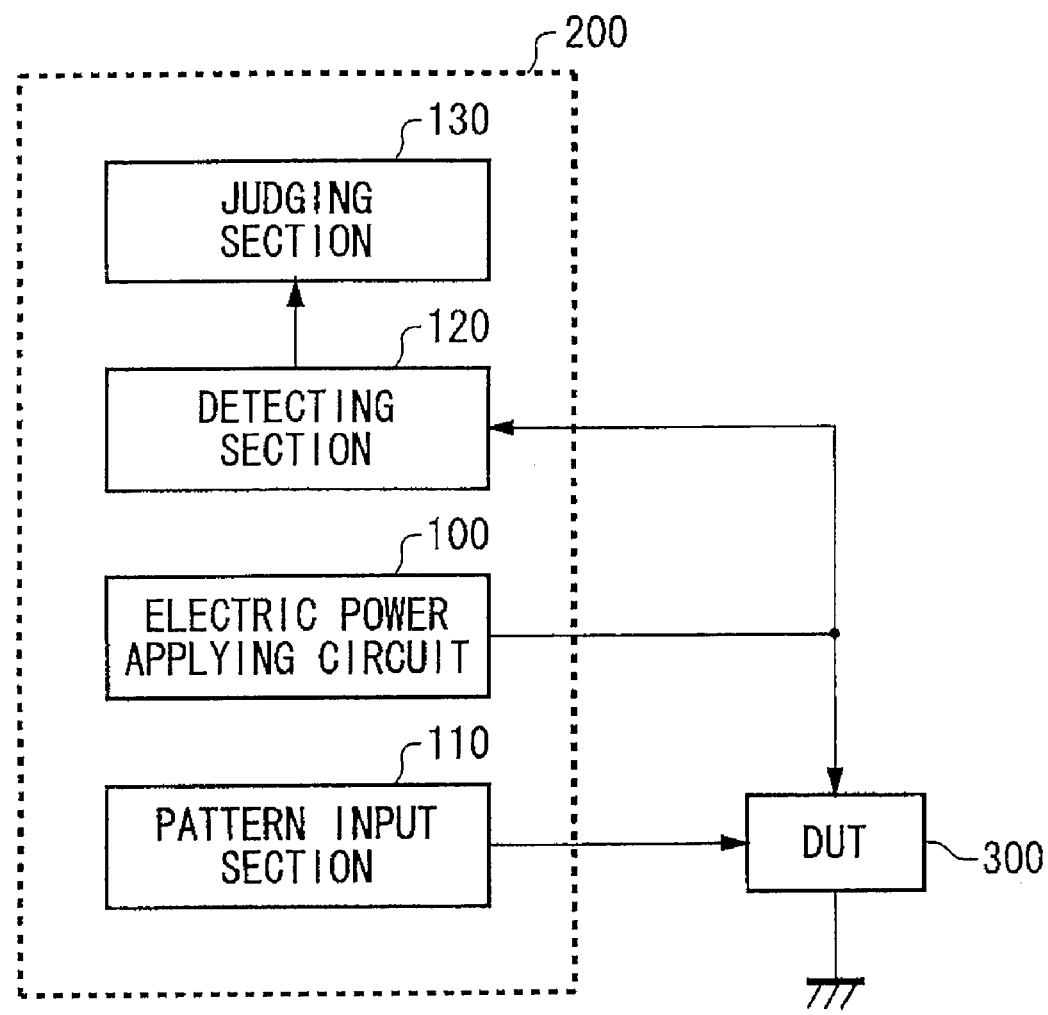
FIG. 6 illustrates an exemplary configuration of a test apparatus 200 relating to an embodiment of the present invention.

FIG. 6 illustrates an exemplary configuration of a test apparatus 200 relating to an embodiment of the present invention. The test apparatus 200 tests the DUT 300 such as a semiconductor circuit. The test apparatus 200 includes therein a pattern input section 110, the electric power applying circuit 100, a detecting section 120, and a judging section 130.

The electric power applying circuit 100 supplies a DC power to the DUT 300. For example, the electric power applying circuit 100 applies a predetermined DC voltage to the DUT 300 when a test is conducted in such a manner that a voltage is applied and a resultant current is measured. The electric power applying circuit 100 applies a predetermined DC current to the DUT 300 when a test is conducted in such a manner that a current is applied and a resultant voltage is measured. The electric power applying circuit 100 may be any one of the electric power applying circuits 100 described with reference to FIGS. 1 to 4, or any one of the electric power applying circuits 100 which are described in the following with reference to FIGS. 7 to 9.

The detecting section 120 detects a DC voltage or DC current applied to the DUT 300. For example, the detecting section 120 detects a DC current when a test is conducted in such a manner that a voltage is applied and a resultant current is measured, and detects a DC voltage when a test is conducted in such a manner that a current is applied and a resultant voltage is measured. In FIG. 6, the electric power applying circuit 100 and detecting section 120 are shown as separate constituents. However, the detecting section 120 may be alternatively provided within the electric power applying circuit 100. For example, the detecting section 120 may be configured by the AD converter 36 and photocoupler 14 described with reference to FIGS. 1 to 4.

The judging section 130 judges whether the DUT 300 is acceptable based on one of the DC voltage and DC current which is detected by the detecting section 120. For example, the judging section 130 may judge whether the DUT 300 is acceptable, by determining whether the DC voltage or DC current falls within a predetermined range.

The pattern input section 110 inputs a test pattern into the DUT 300. When the test apparatus 200 conducts a DC test while the DUT 300 is operating, the detecting section 120 detects one of a DC voltage and a DC current which is observed while the pattern input section 110 is outputting a test pattern. When the test apparatus 200 conducts a DC test while the DUT 300 is not operating, the detecting section 120 detects one of a DC voltage and a DC current which is observed while the pattern input section 110 is not outputting a test pattern.

According to the test apparatus 200 relating to the present embodiment, the electric power applying circuit 100 can apply a high-voltage and high-accuracy voltage to the DUT 300 at low costs. Therefore, the test apparatus 200 can accurately test the DUT 300 at low costs even when the DUT 300 is a high-voltage device.

Figure 7:
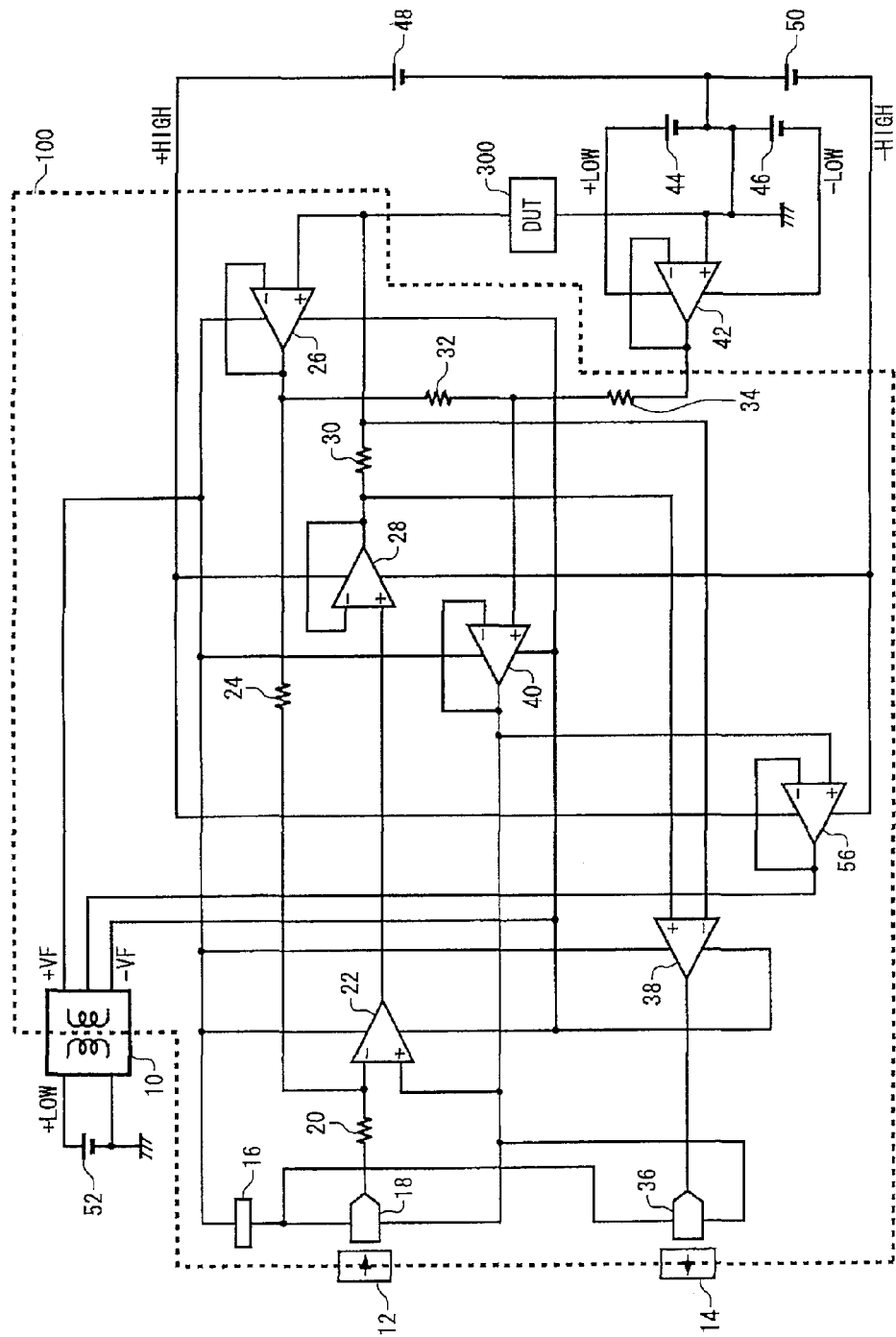
FIG. 7 illustrates another exemplary configuration of the electric power applying circuit 100.

FIG. 7 illustrates another exemplary configuration of the electric power applying circuit 100. According to the present embodiment, the electric power applying circuit 100 further includes therein a reference buffer 56 in addition to the constituents of the electric power applying circuit 100 described with reference to FIG. 1. In the electric power applying circuit 100 shown in FIG. 1, the voltage output from the output buffer 28 is set as the middle-point voltage of the floating power source 10. In the electric power applying circuit 100 relating to the present embodiment, however, the voltage output from the reference buffer 56 is set as the middle-point voltage of the floating power source 10. Other than these configurations, the electric power applying circuit 100 relating to the present embodiment may be configured in the same manner as the electric power applying circuit 100 described with reference to FIG. 1.

The reference buffer 56 outputs a voltage which is substantially equal to the reference voltage output from the reference amplifier 40. According to the present embodiment, the reference buffer 56 may be a voltage follower circuit which receives the reference voltage and outputs the received reference voltage with a gain of multiplication by substantially one. The reference buffer 56 supplies the voltage which is substantially equal to the reference voltage to the floating power source 10, as the middle-point voltage of the floating power source 10.

Based on the above-described configuration, the reference voltage of the DA converter 18 and main amplifier 22 can be controlled substantially equal to the middle-point voltage of the floating power source 10. If the reference voltage of the DA converter 18 and main amplifier 22 is different from the middle-point voltage of the floating power source 10, the range of the voltage which can be set for the DA converter 18 is narrowed.

For example, a case is assumed where the reference voltage and middle-point voltage are both 0 V, the positive floating voltage is higher by 15 V than the middle-point voltage (+10V), and the negative floating voltage is lower by 15 V than the middle-point voltage (−20V). In this case, the main amplifier 22 is supplied with the positive power source voltage of +15 V and the negative power source voltage of −15 V. Here, the main amplifier 22 outputs a voltage determined in accordance with the difference between the reference voltage (0 V) and the input voltage, within the range defined by the power source voltages (−15 V to +15 V). Therefore, the upper limit of the voltage which can be set to the DA converter 18 corresponds to 15 V.

On the other hand, when the reference voltage is 0 V and the middle-point voltage is −5 V, the main amplifier 22 is supplied with the positive power source voltage of +10 V and the negative power source voltage of −20 V. Therefore, the upper limit of the voltage which can be set for the DA converter 18 corresponds to +10 V. Accordingly, the range of the voltage which can be set for the DA converter 18 is narrowed.

In the electric power applying circuit 100 relating to the present embodiment, the reference voltage of the DA converter 18 and main amplifier 22 is controlled so as to be substantially equal to the middle-point voltage of the floating power source 10 as described above. Therefore, the electric power applying circuit 100 relating to the present embodiment can prevent the range of the voltage which can be set for the DA converter 18 from being narrowed.

The power source voltages received by the reference buffer 56 are substantially equal to the power source voltages of the output buffer 28 (+HIGH and −HIGH). In other words, the reference buffer 56 receives the power source voltages from the DC power sources 48 and 50. Accordingly, a current loop can be formed which includes therein, for example, the voltage detecting amplifier 26, first voltage dividing resistance 32, second voltage dividing resistance 34, buffer 42, DC power source 46, DC power source 48, reference buffer 56, and floating power source 10. As a result, the electric power applying circuit 100 relating to the present embodiment can be configured so that a current flows through the first and second voltage dividing resistances 32 and 34.

The power which the reference buffer 56 is capable of outputting may be lower than the power which the output buffer 28 is capable of outputting. For example, the upper limit of the current which the reference buffer 56 is capable of outputting may be lower than the upper limit of the current which the output buffer 28 is capable of outputting. Furthermore, the circuit scale of the reference buffer 56 may be smaller than that of the output buffer 28. Also, the accuracy of the voltage output from the reference buffer 56 may be lower than the accuracy of the voltage output from the main amplifier 22.

The electric power applying circuit 100 relating to the present embodiment additionally includes therein the reference buffer 56, which is a high-voltage buffer. Therefore, the electric power applying circuit 100 relating to the present embodiment can achieve a wider range for the voltage which can be set for the DA converter 18, than the electric power applying circuit 100 described with reference to FIG. 1. Here, as mentioned above, the reference buffer 56 has a relatively small circuit scale. Therefore, the electric power applying circuit 100 relating to the present embodiment can achieve a wider range for the voltage which can be set for the DA converter 18 without significantly increasing the circuit scale.

Figure 8:
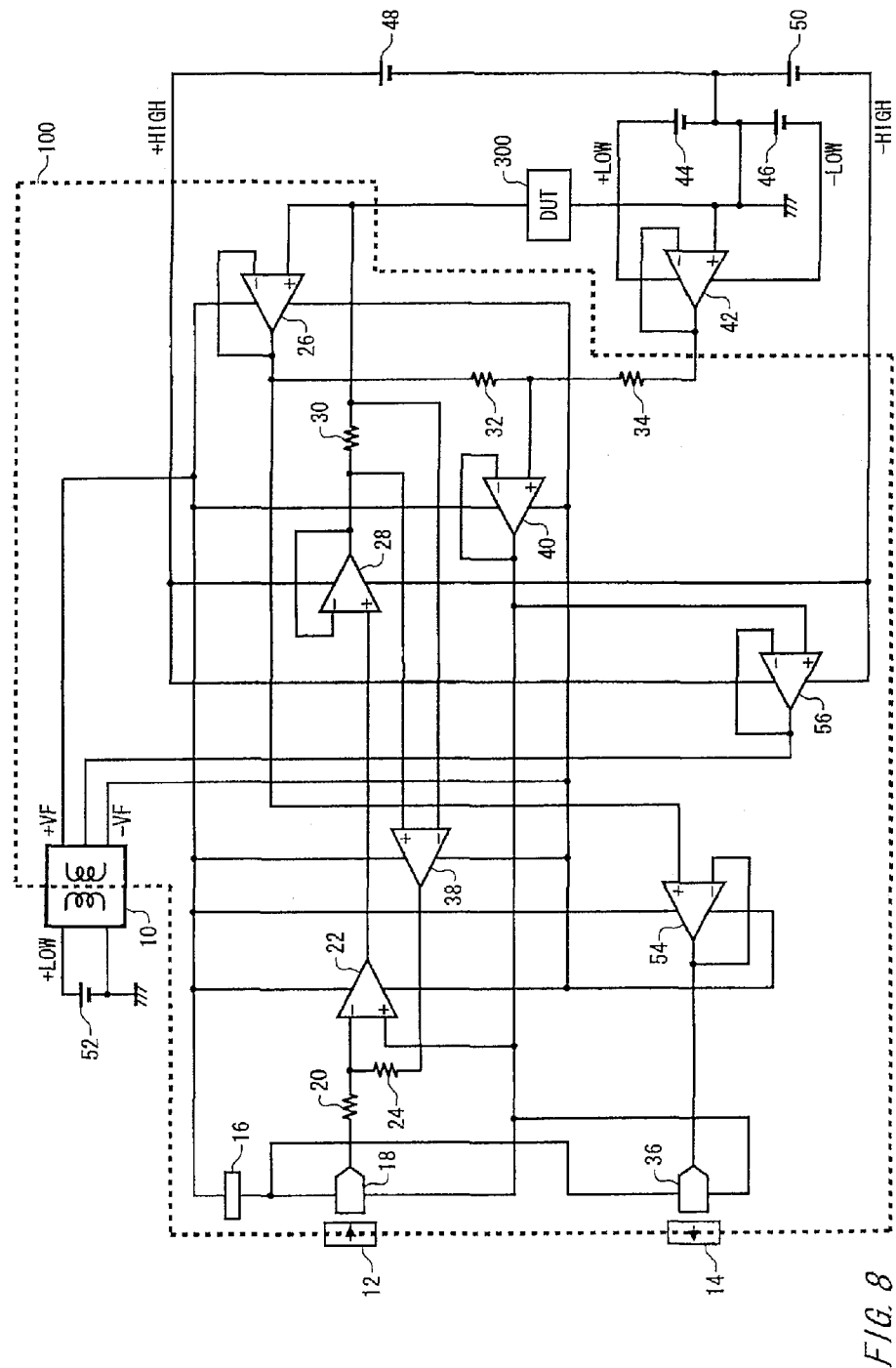
FIG. 8 illustrates another exemplary configuration of the electric power applying circuit 100.

FIG. 8 illustrates another exemplary configuration of the electric power applying circuit 100. According to the present embodiment, the electric power applying circuit 100 further includes therein the reference buffer 56 in addition to the constituents of the electric power applying circuit 100 shown in FIG. 3. While the voltage output from the output buffer 28 is set as the middle-point voltage of the floating power source 10 in the electric power applying circuit 100 shown in FIG. 3, the voltage output from the reference buffer 56 is set as the middle-point voltage of the floating power source 10 in the electric power applying circuit 100 relating to the present embodiment. Other than these configurations, the electric power applying circuit 100 relating to the present embodiment may be configured in the same manner as the electric power applying circuit 100 described with reference to FIG. 3. The reference buffer 56 may be the same as the reference buffer 56 described with reference to FIG. 7.

The reference buffer 56 may be a voltage follower circuit which receives the reference voltage output from the reference amplifier 40 and outputs the received reference voltage with a gain of multiplication by substantially one. The reference buffer 56 supplies the voltage which is substantially equal to the reference voltage to the floating power source 10, as the middle-point voltage of the floating power source 10. The power source voltages received by the reference buffer 56 may be substantially equal to the power source voltages of the output buffer 28 (+HIGH and −HIGH). In other words, the reference buffer 56 may receive the power source voltages from the DC power sources 48 and 50. Here, the power which the reference buffer 56 is capable of outputting may be lower than the power which the output buffer 28 is capable of outputting. Having the above-described configurations, the electric power applying circuit 100 relating to the present embodiment can achieve a wider range for the voltage which can be set for the DA converter 18, similarly to the electric power applying circuit 100 described with reference to FIG. 7.

Figure 9:
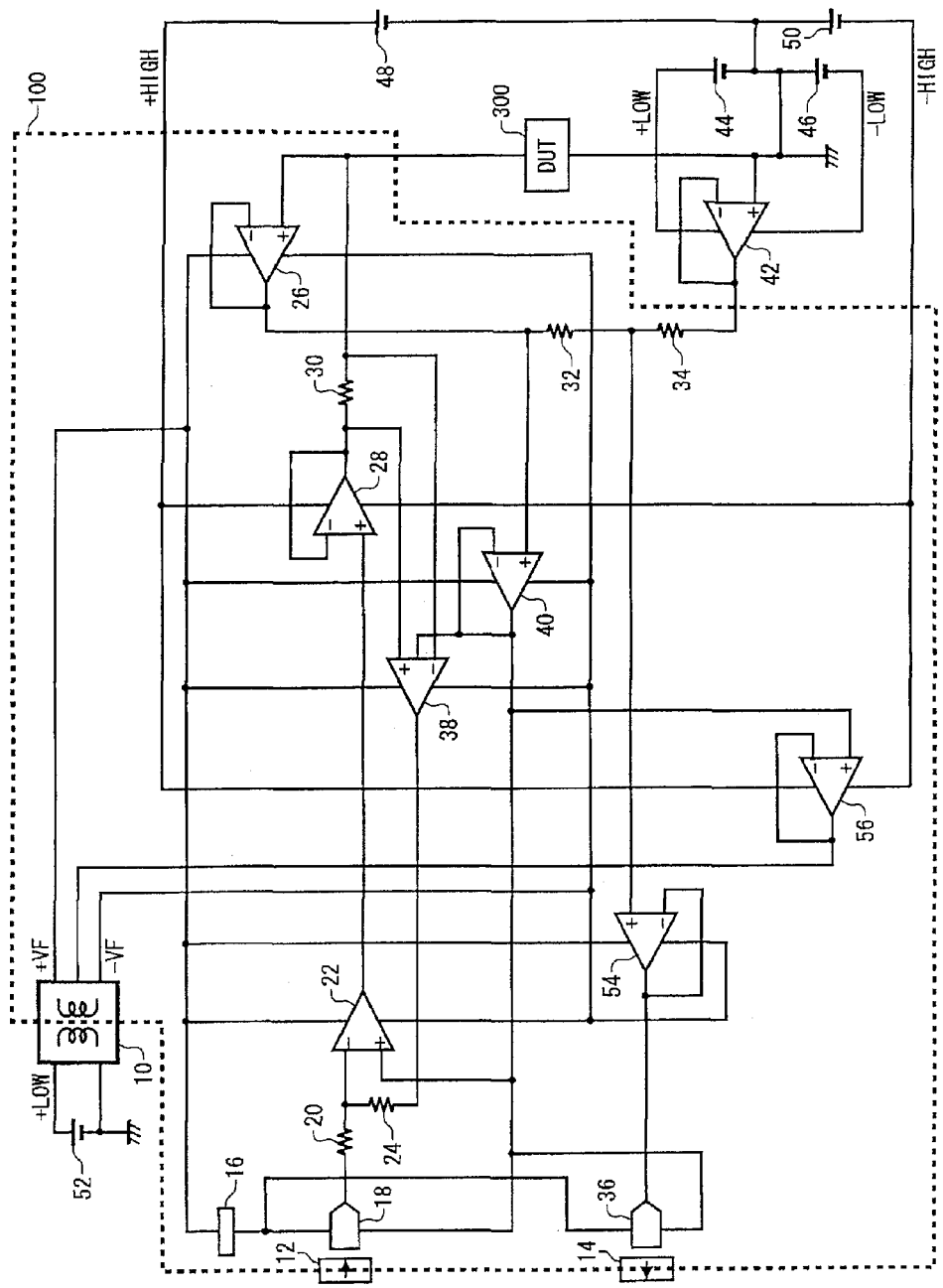
FIG. 9 illustrates another exemplary configuration of the electric power applying circuit 100.

FIG. 9 illustrates another exemplary configuration of the electric power applying circuit 100. The electric power applying circuit 100 relating to the present embodiment further includes therein the reference buffer 56 in addition to the constituents of the electric power applying circuit 100 described with reference to FIG. 4. While the voltage output from the output buffer 28 is set as the middle-point voltage of the floating power source 10 in the electric power applying circuit 100 shown in FIG. 4, the voltage output from the reference buffer 56 is set as the middle-point voltage of the floating power source 10 in the electric power applying circuit 100 relating to the present embodiment. Other than these configurations, the electric power applying circuit 100 relating to the present embodiment may be configured in the same manner as the electric power applying circuit 100 described with reference to FIG. 4. The reference buffer 56 may be the same as the reference buffer 56 described with reference to FIG. 7.

The reference buffer 56 may be a voltage follower circuit which receives the reference voltage output from the reference amplifier 40 and outputs the received reference voltage with a gain of multiplication by substantially one. The reference buffer 56 supplies the voltage which is substantially equal to the reference voltage to the floating power source 10, as the middle-point voltage of the floating power source 10. The power source voltages received by the reference buffer 56 may be substantially equal to the power source voltages of the output buffer 28 (+HIGH and −HIGH). In other words, the reference buffer 56 may receive the power source voltages from the DC power sources. 48 and 50. Here, the power which the reference buffer 56 is capable of outputting may be lower than the power which the output buffer 28 is capable of outputting. Having the above-described configurations, the electric power applying circuit 100 relating to the present embodiment can achieve a wider range for the voltage which can be set to the DA converter 18, similarly to the electric power applying circuit 100 described with reference to FIG. 7.

Figure 10:
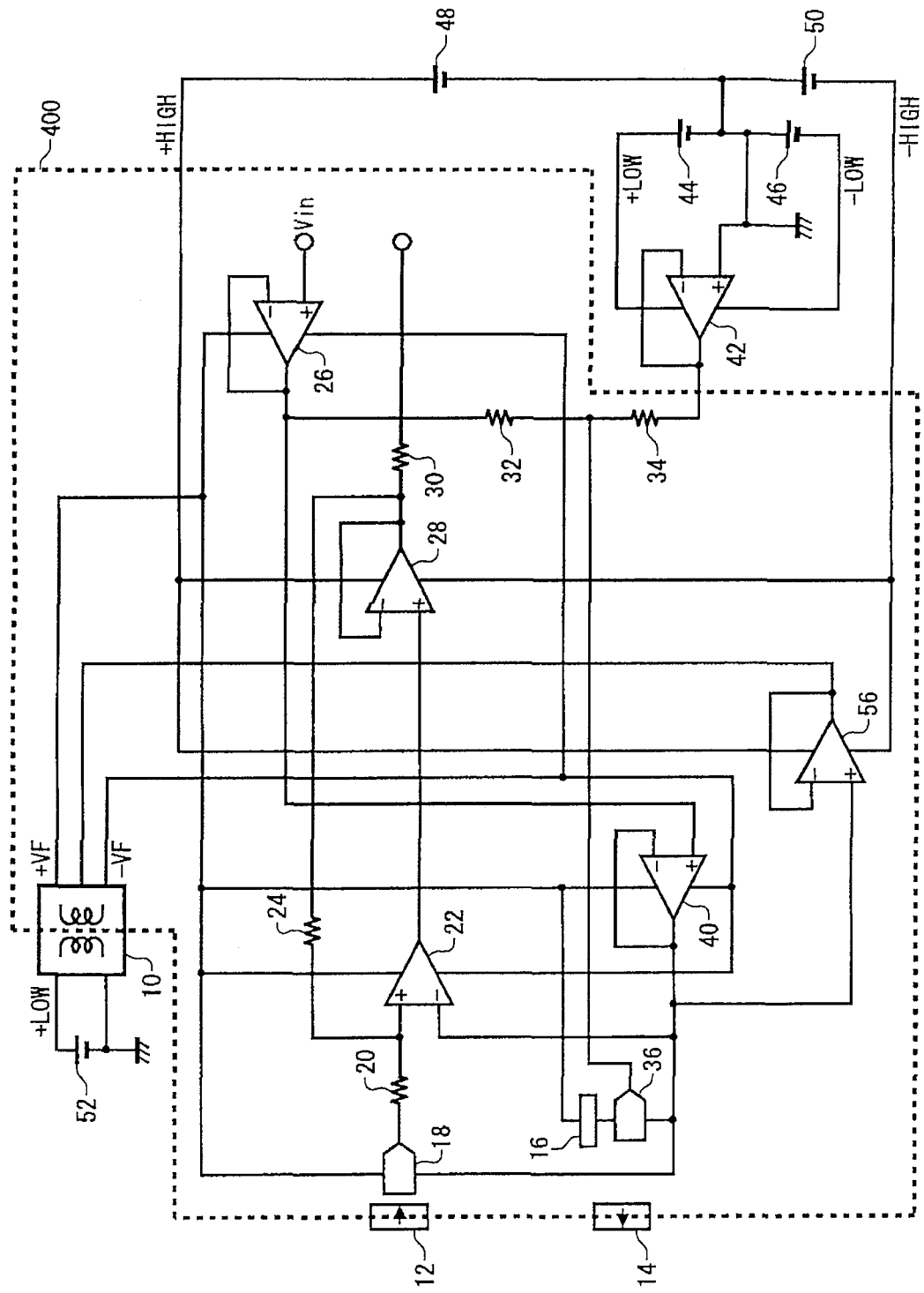
FIG. 10 illustrates another exemplary configuration of the voltage measuring circuit 400.

FIG. 10 illustrates another exemplary configuration of the voltage measuring circuit 400. The voltage measuring circuit 400 relating to the present embodiment further includes therein the reference buffer 56 in addition to the constituents of the voltage measuring circuit 400 described with reference to FIG. 5. While the voltage output from the output buffer 28 is set as the middle-point voltage of the floating power source 10 in the voltage measuring circuit 400 shown in FIG. 5, the voltage output from the reference buffer 56 is set as the middle-point voltage of the floating power source 10 in the electric power applying circuit 100 relating to the present embodiment. Other than these configurations, the voltage measuring circuit 400 relating to the present embodiment may be configured in the same manner as the voltage measuring circuit 400 described with reference to FIG. 5. The reference buffer 56 may be the same as the reference buffer 56 described with reference to FIG. 7.

The reference buffer 56 may be a voltage follower circuit which receives the reference voltage output from the reference amplifier 40 and outputs the received reference voltage with a gain of multiplication by substantially one. The reference buffer 56 supplies the voltage which is substantially equal to the reference voltage to the floating power source 10, as the middle-point voltage of the floating power source 10. The power source voltages received by the reference buffer 56 may be substantially equal to the power source voltages of the output buffer 28 (+HIGH and −HIGH). In other words, the reference buffer 56 may receive the power source voltages from the DC power sources 48 and 50. Here, the power which the reference buffer 56 is capable of outputting may be lower than the power which the output buffer 28 is capable of outputting. Having the above-described configurations, the voltage measuring circuit 400 relating to the present embodiment can achieve a wider range for the voltage which can be set to the DA converter 18, similarly to the electric power applying circuit 100 described with reference to FIG. 7.

Note that the above-described electric power applying circuits 100 and voltage measuring circuits 400 may further include therein a bypass capacitor which is provided in parallel with the second voltage dividing resistance 34. In this way, the electric power applying circuits 100 and voltage measuring circuits 400 can reduce a sudden change in power source.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As clearly indicated by the above description, the embodiments of the present invention enable a high-voltage and high-accuracy voltage to be generated with the use of low-cost circuits. Also, the embodiments of the present invention make it possible to accurately test high-voltage DUTs at low costs. In addition, the embodiments of the present invention can prevent the range of the voltage which can be set for a DA converter from being narrowed.

What is claimed is:

1. An electric power applying circuit for applying a direct current power to a load, comprising:
    an output buffer that (i) is supplied with, as power source voltages, positive and negative high voltages which are determined in accordance with a range of an applied voltage which is to be applied to the load, (ii) generates a voltage in accordance with an input voltage, within a range defined by the power source voltages, and (iii) applies the generated voltage to the load;
    a main amplifier that amplifies a voltage input thereto to generate the input voltage, and inputs the generated input voltage into the output buffer, the main amplifier exhibiting a higher accuracy in terms of voltage generation than the output buffer; and
    a floating power source that generates positive and negative floating voltages by using, as a reference, a voltage determined in accordance with a voltage output from the output buffer, and supplies the generated positive and negative floating voltages to the main amplifier as power source voltages thereof, wherein a difference in voltage between the positive and negative floating voltages is smaller than a difference in voltage between the positive and negative high voltages.

2. The electric power applying circuit as set forth in claim 1, further comprising
    a reference amplifier that generates a reference voltage which is used as a reference for a voltage output from the main amplifier, based on the voltage output from the output buffer, and supplies the generated reference voltage to the main amplifier.

3. The electric power applying circuit as set forth in claim 2, wherein
    the floating power source further supplies the floating voltages to the reference amplifier as power source voltages thereof.

4. The electric power applying circuit as set forth in claim 2, further comprising
    first and second voltage dividing resistances that divide the applied voltage which is applied to the load, wherein
    the reference amplifier generates the reference voltage based on a voltage obtained in such a manner that the first and second voltage dividing resistances divide the applied voltage which is applied to the load.

5. The electric power applying circuit as set forth in claim 4, wherein
    the first voltage dividing resistance is supplied at one end thereof with the applied voltage, and connected at the other end thereof to the second voltage dividing resistance, and
    the second voltage dividing resistance has a resistance value equal to or higher than a resistance value of the first voltage dividing resistance, connected at one end thereof to the first voltage dividing resistance, and connected at the other end thereof to a ground potential.

6. The electric power applying circuit as set forth in claim 2, further comprising
    a DA converter that generates a direct current voltage to be input into the main amplifier, by using a voltage output from the reference amplifier as a reference voltage.

7. The electric power applying circuit as set forth in claim 1, wherein
    the floating power source generates the floating voltages by using, as a reference, the voltage output from the output buffer.

8. The electric power applying circuit as set forth in claim 2, wherein
    the floating power source generates the floating voltages by using, as a reference, a voltage determined in accordance with a voltage output from the reference amplifier.

9. The electric power applying circuit as set forth in claim 8, further comprising
    a reference buffer that receives the reference voltage which is input by the reference amplifier into the main amplifier, and outputs a voltage which is substantially equal to the reference voltage, wherein
    the floating power source generates the floating voltages by using, as a reference, the voltage output from the reference buffer.

10. The electric power applying circuit as set forth in claim 9, wherein
    a power which the reference buffer is capable of outputting is lower than a power which the output buffer is capable of outputting.

11. The electric power applying circuit as set forth in claim 10, wherein
    the reference buffer is supplied with power source voltages which are substantially equal to the power source voltages supplied to the output buffer, and
    the floating voltages are supplied to the reference amplifier as power source voltages thereof.

12. The electric power applying circuit as set forth in claim 10, wherein
    the reference buffer receives the reference voltage output from the reference amplifier, and outputs the received reference voltage with a gain of multiplication by substantially one.

13. The electric power applying circuit as set forth in claim 1, further comprising a voltage detecting amplifier that receives the applied voltage which is applied to the load, and maintains the applied voltage at a substantially constant level by feeding back the applied voltage into the main amplifier, wherein the floating power source further supplies the floating voltages to the voltage detecting amplifier as power source voltages thereof.

14. The electric power applying circuit as set forth in claim 13, further comprising:

a current detecting resistance that is provided between the output buffer and the load;

a current detecting amplifier that detects voltages applied to both ends of the current detecting resistance; and a current detecting section that detects a value of a current supplied to the load based on a voltage output from the current detecting amplifier, wherein the floating power source further supplies the floating voltages to the current detecting amplifier as power source voltages thereof.

15. The electric power applying circuit as set forth in claim 1, further comprising:

a current detecting resistance that is provided between the output buffer and the load; and a current detecting amplifier that detects voltages applied to both ends of the current detecting resistance, and maintains a current supplied to the load at a substantially constant level by feeding back the detected voltages to the main amplifier, wherein the floating power source further supplies the floating voltages to the current detecting amplifier as power source voltages thereof.

16. The electric power applying circuit as set forth in claim 15, further comprising:

a voltage detecting amplifier that receives the applied voltage which is applied to the load, and outputs a voltage determined in accordance with the applied voltage which is applied to the load; and a voltage detecting section that detects a voltage value of the applied voltage, based on the voltage output from the voltage detecting amplifier, wherein the floating power source further supplies the floating voltages to the voltage detecting amplifier as power source voltages thereof.

17. A test apparatus for testing a device under test, comprising:

an electric power applying circuit that supplies a direct current power to the device under test, including:

an output buffer that (i) is supplied with, as power source voltages, positive and negative high voltages which are determined in accordance with a range of an applied voltage which is to be applied to the device under test, (ii) generates a voltage in accordance with an input voltage, within a range defined by the power source voltages, and (iii) applies the generated voltage to the device under test;

a main amplifier that amplifies a voltage input thereto to generate the input voltage, and inputs the generated input voltage into the output buffer, the main amplifier exhibiting a higher accuracy in terms of voltage generation than the output buffer; and a floating power source that generates positive and negative floating voltages by using, as a reference, a voltage determined in accordance with a voltage output from the output buffer, and supplies the generated positive and negative floating voltages to the main amplifier as power source voltages thereof, wherein a difference in voltage between the positive and negative floating voltages is smaller than a difference in voltage between the positive and negative high voltages;

a detecting section that detects one of a voltage and a current supplied to the device under test; and a judging section that judges whether the device under test is acceptable based on the voltage or current detected by the detecting section.

18. The test apparatus as set forth in claim 17, further comprising a reference amplifier that generates a reference voltage which is used as a reference for a voltage output from the main amplifier, based on the voltage output from the output buffer, and supplies the generated reference voltage to the main amplifier.

19. The test apparatus as set forth in claim 17, wherein the floating power source generates the floating voltages by using, as a reference, the voltage output from the output buffer.

20. The test apparatus as set forth in claim 17, further comprising a voltage detecting amplifier that receives the applied voltage which is applied to the device under test, and maintains the applied voltage at a substantially constant level by feeding back the applied voltage into the main amplifier, wherein the floating power source further supplies the floating voltages to the voltage detecting amplifier as power source voltages thereof.

21. The test apparatus as set forth in claim 17, further comprising:

a current detecting resistance that is provided between the output buffer and the device under test; and a current detecting amplifier that detects voltages applied to both ends of the current detecting resistance, and maintains a current supplied to the device under test at a substantially constant level by feeding back the detected voltages to the main amplifier, wherein the floating power source further supplies the floating voltages to the current detecting amplifier as power source voltages thereof.

* * * * *